United States Patent
Chang et al.

(10) Patent No.: US 8,513,119 B2
(45) Date of Patent: Aug. 20, 2013

(54) METHOD OF FORMING BUMP STRUCTURE HAVING TAPERED SIDEWALLS FOR STACKED DIES

(75) Inventors: Hung-Pin Chang, Taipei (TW); Kuo-Ching Hsu, Taipei (TW); Chen-Shien Chen, Zhubei (TW); Wen-Chih Chiou, Miaoli (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 34 days.

(21) Appl. No.: 12/331,900

(22) Filed: Dec. 10, 2008

(65) Prior Publication Data
US 2010/0140805 A1 Jun. 10, 2010

(51) Int. Cl.
*H01L 21/44* (2006.01)

(52) U.S. Cl.
USPC ............ 438/667; 257/E21.577; 257/E21.585

(58) Field of Classification Search
USPC .................. 438/667; 257/E21.577, E21.585
See application file for complete search history.

(56) References Cited

U.S. PATENT DOCUMENTS

| | | | |
|---|---|---|---|
| 5,391,917 A | 2/1995 | Gilmour et al. | |
| 5,426,072 A | 6/1995 | Finnila | |
| 5,510,298 A | 4/1996 | Redwine | |
| 5,646,067 A | 7/1997 | Gaul | |
| 5,767,001 A | 6/1998 | Bertagnolli et al. | |
| 5,998,292 A | 12/1999 | Black et al. | |
| 6,034,436 A | 3/2000 | Iwasaki | |
| 6,184,060 B1 | 2/2001 | Siniaguine | |
| 6,322,903 B1 | 11/2001 | Siniaguine et al. | |
| 6,417,087 B1 | 7/2002 | Chittipeddi et al. | |
| 6,448,168 B1 | 9/2002 | Rao et al. | |
| 6,451,684 B1 * | 9/2002 | Kim et al. ..................... 438/622 |
| 6,465,892 B1 | 10/2002 | Suga | |
| 6,472,293 B1 | 10/2002 | Suga | |
| 6,498,381 B2 | 12/2002 | Halahan et al. | |
| 6,538,333 B2 | 3/2003 | Kong | |
| 6,599,778 B2 | 7/2003 | Pogge et al. | |
| 6,639,303 B2 | 10/2003 | Siniaguine | |

(Continued)

FOREIGN PATENT DOCUMENTS

| | | |
|---|---|---|
| JP | 2009004730 A | 1/2009 |
| JP | 2009147218 A | 7/2009 |

OTHER PUBLICATIONS

Ranganathan, N., et al., "Integration of High Aspect Ratio Tapered Silicon Via for Through-Silicon Interconnection," Electronic Components and Technology Conference, IEEE, 2008, pp. 859-865.

*Primary Examiner* — Howard Weiss
(74) *Attorney, Agent, or Firm* — Slater & Matsil, L.L.P.

(57) ABSTRACT

A bump structure that may be used for stacked die configurations is provided. Through-silicon vias are formed in a semiconductor substrate. A backside of the semiconductor substrate is thinned to expose the through-silicon vias. An isolation film is formed over the backside of the semiconductor substrate and the exposed portion of the through-silicon vias. The isolation film is thinned to re-expose the through-silicon vias. Bump pads and redistribution lines are formed on the backside of the semiconductor substrate providing an electrical connection to the through-silicon vias. Another isolation film is deposited and patterned, and a barrier layer is formed to provide contact pads for connecting to an external device, e.g., another die/wafer or circuit board.

12 Claims, 17 Drawing Sheets

(56) References Cited

U.S. PATENT DOCUMENTS

| | | |
|---|---|---|
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,873,054 B2 * | 3/2005 | Miyazawa et al. ............ 257/774 |
| 6,882,030 B2 | 4/2005 | Siniaguine |
| 6,897,125 B2 | 5/2005 | Morrow et al. |
| 6,908,856 B2 | 6/2005 | Beyne et al. |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,224,063 B2 | 5/2007 | Agarwala et al. |
| 7,262,495 B2 | 8/2007 | Chen et al. |
| 7,297,574 B2 | 11/2007 | Thomas et al. |
| 7,300,857 B2 | 11/2007 | Akram et al. |
| 7,335,972 B2 | 2/2008 | Chanchani |
| 7,355,273 B2 | 4/2008 | Jackson et al. |
| 7,514,775 B2 | 4/2009 | Chao et al. |
| 7,528,068 B2 * | 5/2009 | Soejima et al. ............... 438/667 |
| 7,772,081 B2 * | 8/2010 | Lin et al. ....................... 438/393 |
| 7,772,116 B2 * | 8/2010 | Akram et al. .................. 438/667 |
| 7,919,835 B2 | 4/2011 | Akiyama |
| 7,969,016 B2 | 6/2011 | Chen et al. |
| 8,034,704 B2 | 10/2011 | Komai et al. |
| 8,097,964 B2 | 1/2012 | West et al. |
| 8,174,124 B2 | 5/2012 | Chiu et al. |
| 8,264,077 B2 | 9/2012 | Chiou et al. |
| 8,294,261 B2 | 10/2012 | Mawatari et al. |
| 2002/0084513 A1 | 7/2002 | Siniaguine |
| 2002/0113321 A1 | 8/2002 | Siniaguine |
| 2002/0182855 A1 | 12/2002 | Agarwala et al. |
| 2003/0148600 A1 | 8/2003 | Furukawa et al. |
| 2004/0048459 A1 | 3/2004 | Patti |
| 2004/0245623 A1 | 12/2004 | Hara et al. |
| 2005/0221601 A1 | 10/2005 | Kawano |
| 2005/0233581 A1 | 10/2005 | Soejima et al. |
| 2006/0273465 A1 | 12/2006 | Tamura |
| 2006/0289968 A1 | 12/2006 | Sulfridge |
| 2007/0032061 A1 | 2/2007 | Farnworth et al. |
| 2007/0049016 A1 | 3/2007 | Hiatt et al. |
| 2008/0054444 A1 | 3/2008 | Tuttle |
| 2008/0136023 A1 | 6/2008 | Komai et al. |
| 2008/0211106 A1 | 9/2008 | Chang et al. |
| 2009/0014843 A1 | 1/2009 | Kawashita et al. |
| 2009/0152602 A1 | 6/2009 | Akiyama |
| 2009/0269905 A1 | 10/2009 | Chen et al. |
| 2009/0283898 A1 * | 11/2009 | Janzen et al. ................. 257/698 |
| 2009/0315184 A1 | 12/2009 | Tokitoh |
| 2010/0013060 A1 | 1/2010 | Lamy et al. |
| 2010/0038800 A1 | 2/2010 | Yoon et al. |
| 2010/0127394 A1 | 5/2010 | Ramiah et al. |
| 2010/0171197 A1 | 7/2010 | Chang et al. |
| 2010/0171226 A1 | 7/2010 | West et al. |
| 2010/0330798 A1 | 12/2010 | Huang et al. |
| 2011/0049706 A1 | 3/2011 | Huang et al. |
| 2011/0068466 A1 | 3/2011 | Chen et al. |
| 2011/0186990 A1 | 8/2011 | Mawatari et al. |
| 2011/0233785 A1 | 9/2011 | Koester et al. |
| 2011/0241217 A1 | 10/2011 | Chang et al. |
| 2011/0318917 A1 | 12/2011 | Yoon et al. |
| 2013/0001799 A1 | 1/2013 | Chang et al. |

* cited by examiner

METHOD OF FORMING BUMP STRUCTURE HAVING TAPERED SIDEWALLS FOR STACKED DIES

TECHNICAL FIELD

This invention relates generally to integrated circuits and, more particularly, to bump structures for use with semiconductor dies having through-silicon vias for stacked die configurations.

BACKGROUND

Since the invention of the integrated circuit, the semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more components to be integrated into a given area.

These integration improvements are essentially two-dimensional (2D) in nature, in that the volume occupied by the integrated components is essentially on the surface of the semiconductor wafer. Although dramatic improvement in lithography has resulted in considerable improvement in 2D integrated circuit (IC) formation, there are physical limits to the density that can be achieved in two dimensions. One of these limits is the minimum size needed to make these components. Also, when more devices are put into one chip, more complex designs are required.

In an attempt to further increase circuit density, three-dimensional (3D) ICs have been investigated. In a typical formation process of a 3D IC, two dies are bonded together and electrical connections are formed between each die and contact pads on a substrate. For example, one attempt involved bonding two dies on top of each other. The stacked dies were then bonded to a carrier substrate and wire bonds electrically coupled contact pads on each die to contact pads on the carrier substrate. This attempt, however, requires a carrier substrate larger than the dies for the wire bonding.

More recent attempts have focused on through-silicon vias (TSVs). Generally, a TSV is formed by etching a vertical via through a substrate and filling the via with a conductive material, such as copper. The backside of the substrate is thinned to expose the TSVs, and another die is bonded to the exposed TSVs, thereby forming a stacked die package. If the substrate is to be bonded to another die/wafer using a different technology or pin-out, then a redistribution layer is needed.

The thermal budget is usually an issue because the substrate is bonded to a temporary carrier before the substrate thinned and bonded. In order to achieve a low-temperature bonding process, solder balls are used for bonding another substrate to the TSVs. The requirement for a redistribution layer, however, requires additional layer processes to create the redistribution layer, and it is difficult to form the redistribution layer within the thermal budget.

Accordingly, there is a need for a better structure and method of bonding to TSV structures.

SUMMARY OF THE INVENTION

These and other problems are generally reduced, solved or circumvented, and technical advantages are generally achieved, by embodiments of the present invention, which provides bump structures for use with semiconductor dies having through-silicon vias for a stacked die configuration.

In accordance with an embodiment of the present invention, a semiconductor device is provided. The semiconductor device has a semiconductor substrate with through-silicon vias extending through and protruding from a backside of the semiconductor substrate. A first isolation film is on the backside of the semiconductor substrate between adjacent ones of the through-silicon vias such that the isolation film does not extend beyond the through-silicon vias. Conductive elements having tapered sidewalls are electrically coupled to the through-silicon vias, and a second isolation film is on the first isolation film. In other embodiments, the conductive elements include a redistribution line and have a tapered sidewall. The redistribution line may be between the first isolation film and the second isolation film.

In accordance with another embodiment of the present invention, a method of forming a semiconductor device is provided. A semiconductor substrate having a through-silicon via extending from a first side into the semiconductor substrate is provided. The through-silicon via is exposed on a backside of the semiconductor substrate, and a first isolation film is formed on the backside of the semiconductor substrate such that the through-silicon via is exposed. A conductive element having tapered sidewalls is formed on the through-silicon via. A second isolation film of a different material than the first isolation film is formed on the first isolation film. A contact barrier layer is formed over the conductive element. The conductive element may include a redistribution line.

In accordance with yet another embodiment of the present invention, another method of forming a semiconductor device is provided. The method includes providing a first semiconductor substrate having a plurality of through-silicon vias extending from a circuit-side to a backside of the first semiconductor substrate and a conductive pad having tapered sidewalls being located over each of the plurality of through-silicon vias on the backside. The backside of the first semiconductor substrate has a first isolation film and a second isolation film on the first isolation film. A second semiconductor substrate having a plurality of top contacts is provided. The first semiconductor substrate and the second semiconductor substrate are bonded together, such that each of the top contacts of the second semiconductor substrate are electrically coupled with respective ones of the conductive pads on the first semiconductor substrate.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Embodiments of the present invention relate to the use of metal bump pads with a substrate having through-silicon vias. As will be discussed below, embodiments are disclosed that integrate the metal bump pads and a redistribution layer, thereby enabling the simultaneous formation of the redistribution layer with the formation of the metal bumps. Furthermore, the metal bumps are preferably provided with tapered sidewalls, thereby providing a larger bonding interface for wafer and/or die stacking processes.

The intermediate stages of a method for forming a die having a bump structure and/or a redistribution layer suitable for use in a three-dimensional (3D) integrated circuit (IC) or stacked die configuration are illustrated in FIGS. 1-14. Throughout the various views and illustrative embodiments of the present invention, like reference numbers are used to designate like elements.

Figure 1:
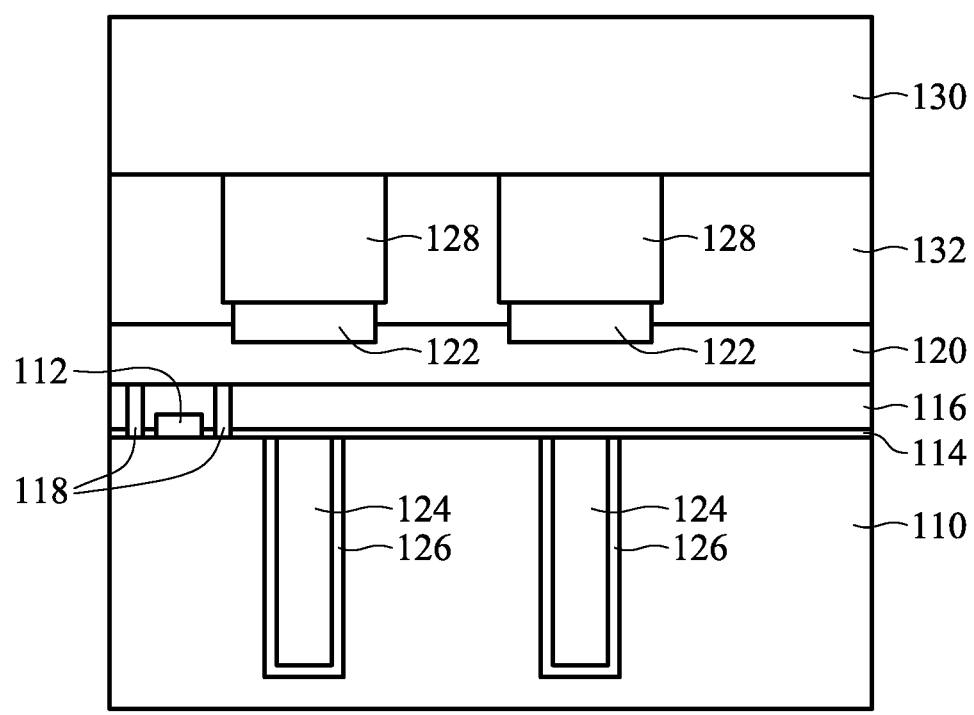
FIGS. 1-13 illustrate intermediate stages in forming a semiconductor device having a bump structure that may be used in a stacked die configuration in accordance with an embodiment of the present invention.

Referring first to FIG. 1, a semiconductor substrate 110 having electrical circuitry 112 formed thereon is shown. The semiconductor substrate 110 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, typically a silicon or glass substrate. Other substrates, such as a multi-layered or gradient substrate may also be used.

The electrical circuitry 112 formed on the semiconductor substrate 110 may be any type of circuitry suitable for a particular application. In an embodiment, the circuitry includes electrical devices formed on the substrate with one or more dielectric layers overlying the electrical devices. Metal layers may be formed between dielectric layers to route electrical signals between the electrical devices. Electrical devices may also be formed in one or more dielectric layers.

For example, the electrical circuitry 112 may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of the present invention and are not meant to limit the present invention in any manner. Other circuitry may be used as appropriate for a given application.

Also shown in FIG. 1 are an etch stop layer 114 and an inter-layer dielectric (ILD) layer 116. The etch stop layer 114 is preferably formed of a dielectric material having a different etch selectivity from adjacent layers, e.g., the underlying semiconductor substrate 110 and the overlying ILD layer 116. In an embodiment, the etch stop layer 114 may be formed of SiN, SiCN, SiCO, CN, combinations thereof, or the like, deposited by chemical vapor deposition (CVD) or plasma-enhanced CVD (PECVD) techniques.

The ILD layer 116 may be formed, for example, of a low-K dielectric material, such as silicon oxide, phosphosilicate glass (PSG), borophosphosilicate glass (BPSG), fluorinated silicate glass (FSG), $SiO_xC_y$, Spin-On-Glass, Spin-On-Polymers, silicon carbon material, compounds thereof, composites thereof, combinations thereof, or the like, by any suitable method known in the art, such as spinning, CVD, and PECVD. It should also be noted that the etch stop layer 114 and the ILD layer 116 may each comprise a plurality of dielectric layers, with or without an etch stop layer formed between adjacent dielectric layers.

Contacts 118 are formed through the ILD layer 116 to provide an electrical contact to the electrical circuitry 112. The contacts 118 may be formed, for example, by using photolithography techniques to deposit and pattern a photoresist material on the ILD layer 116 to expose portions of the ILD layer 116 that are to become the contacts 118. An etch process, such as an anisotropic dry etch process, may be used to create openings in the ILD layer 116. The openings are, preferably, lined with a diffusion barrier layer and/or an adhesion layer (not shown), and filled with a conductive material. Preferably, the diffusion barrier layer comprises one or more layers of TaN, Ta, TiN, Ti, CoW, or the like, and the conductive material comprises copper, tungsten, aluminum, silver, and combinations thereof, or the like, thereby forming the contacts 118 as illustrated in FIG. 1.

One or more inter-metal dielectric (IMD) layers 120 and the associated metallization layers (not shown) are formed over the ILD layer 116. Generally, the one or more IMD layers 120 and the associated metallization layers are used to interconnect the electrical circuitry to each other and to provide an external electrical connection. The IMD layers 120 are preferably formed of a low-K dielectric material, such as fluorosilicate glass (FSG) formed by PECVD techniques or high-density plasma chemical vapor deposition (HDPCVD) or the like, and may include intermediate etch stop layers, similar to etch stop layer 114. Top metal contacts 122 are provided in the uppermost IMD layer to provide external electrical connections.

Also shown in FIG. 1 are through-silicon vias 124. The through-silicon vias 124 may be formed by any appropriate method. For example, openings may be formed extending into the semiconductor substrate 110 prior to forming the ILD layer 116 by, for example, one or more etching processes, milling, laser techniques, or the like. The openings are preferably lined with a liner, such as liner 126, that acts as an isolation layer, and filled with a conductive material. Preferably, the liner 126 comprises one or more layers of SiN, an oxide, a polymer, or the like, and the conductive material comprises copper, tungsten, aluminum, silver, and combinations thereof, or the like, thereby forming the through-silicon vias 124. Other materials, including conductive diffusion barrier layers, such as TaN, Ta, TiN, Ti, CoW, or the like, may also be used.

It should be noted that the through-silicon vias 124 are illustrated as extending in the semiconductor substrate 110 from a top surface of the semiconductor substrate 110 for illustrative purposes only and that other arrangements may be utilized. For example, in another embodiment the through-silicon vias 124 may extend from a top surface of the ILD layer 116 or one of the IMD layers 120. For example, in an embodiment, the through-silicon vias 124 are formed by creating openings extending into the semiconductor substrate 110 after forming the contacts 118 by, for example, one or more etching processes, milling, laser techniques, or the like. The openings are also preferably lined with a liner, such as liner 126, that acts as an isolation layer, and filled with a conductive material as discussed above.

Conductive bumps 128, such as metal bumps formed of Cu, W, CuSn, AuSn, InAu, PbSn, or the like, are formed on the top metal contacts 122, and a carrier substrate 130 is attached to a top surface of the IMD layers 120 using an adhesive 132. Generally, the carrier substrate 130 provides temporary mechanical and structural support during subsequent processing steps. In this manner, damage to the semiconductor substrate 110 is reduced or prevented.

The carrier substrate 130 may comprise, for example, glass, silicon oxide, aluminum oxide, and the like. The adhesive 132 may be any suitable adhesive, such as an ultraviolet (UV) glue, which loses its adhesive property when exposed to UV lights. The preferred thickness of the carrier substrate 130 is preferably between about a few mils to about tens of mils.

Figure 2:
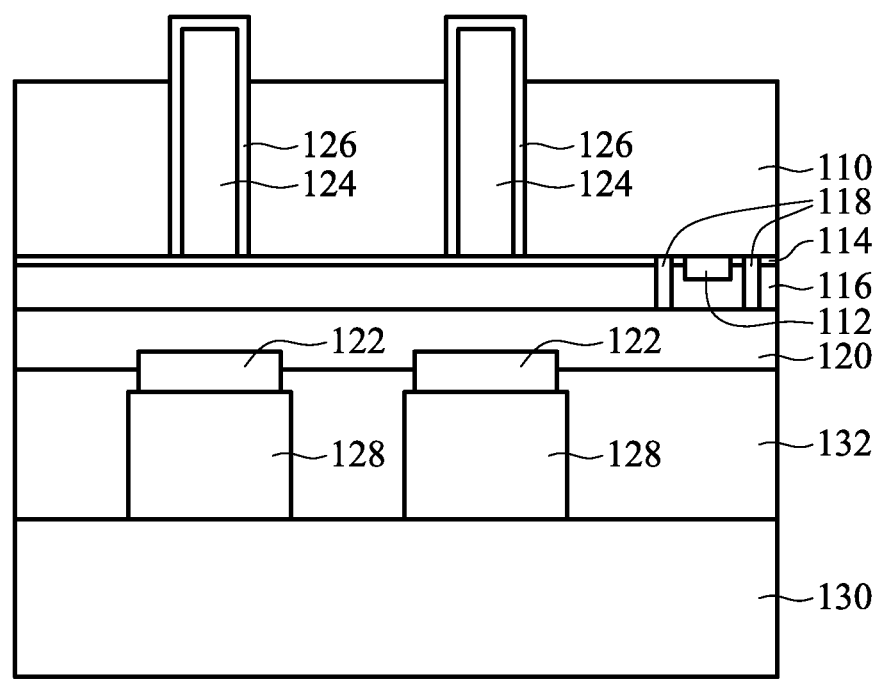

FIG. 2 illustrates a thinning process performed on a backside of the semiconductor substrate 110 to expose the through-silicon vias 124/liners 126 in accordance with an embodiment of the present invention. The thinning process may be performed using a mechanical grinding process, a chemical mechanical polishing (CMP) process, an etching process, and/or a combination thereof. For example, initially a planarizing process, such as grinding or a CMP, may be performed to initially expose the through-silicon vias 124. Thereafter, a wet or dry etching process having a high etch-rate selectivity between the material of the liners 126 and the material of the semiconductor substrate 110 may be performed to recess the semiconductor substrate 110, thereby leaving the through-silicon vias 124 and the liners 126 protruding from the underside of the semiconductor substrate 110 as illustrated in FIG. 2. In an embodiment in which the through-silicon vias 124 are formed of copper and the liners 126 are formed of TaN, the semiconductor substrate 110 may be recessed by, for example, performing a dry etch process using $HBr/O_2$, $HBr/Cl_2/O_2$, $SF_6/Cl_2$, $SF_6$ plasma, or the like. Preferably, the through-silicon vias 124 and the liners 126 are exposed in the range of about sub-μm to about a few μms.

Figure 3:
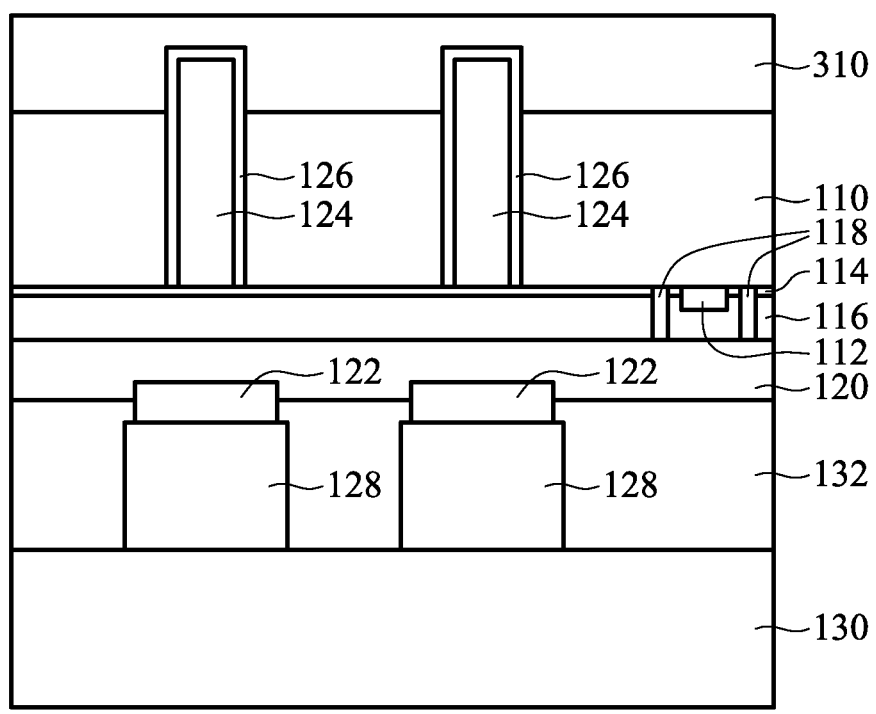

FIG. 3 illustrates a first isolation film 310 formed over the backside of the semiconductor substrate 110 (or a native oxide that may be formed on the surface of the semiconductor substrate 110) in accordance with an embodiment of the present invention. In a preferred embodiment, the first isolation film 310 is a dielectric material, such as SiN, an oxide, SiC, SiON, a polymer, or the like, and may be formed by, for example, spin-coating, printing, a CVD process, or the like. Preferably, the first isolation film 310 is formed using a low-temperature process, e.g., using temperatures less than 250° C. by a PECVD process, preventing the bonding adhesive from degrading to ensure the mechanical strength throughout the integration process. The first isolation film 310 is preferably formed having a thickness sufficient to cover the exposed through-silicon vias 124.

Depending on the process utilized to form the first isolation film 310, it may be desirable to perform a planarization process. In particular, some methods of deposition, such as spin-coating, create a planar surface, but other methods, such as a CVD process, form a conformal layer, and as a result, it may be desirable to perform a planarization process, such as a grinding or CMP process, to create a planar surface as illustrated in FIG. 3.

Figure 4:
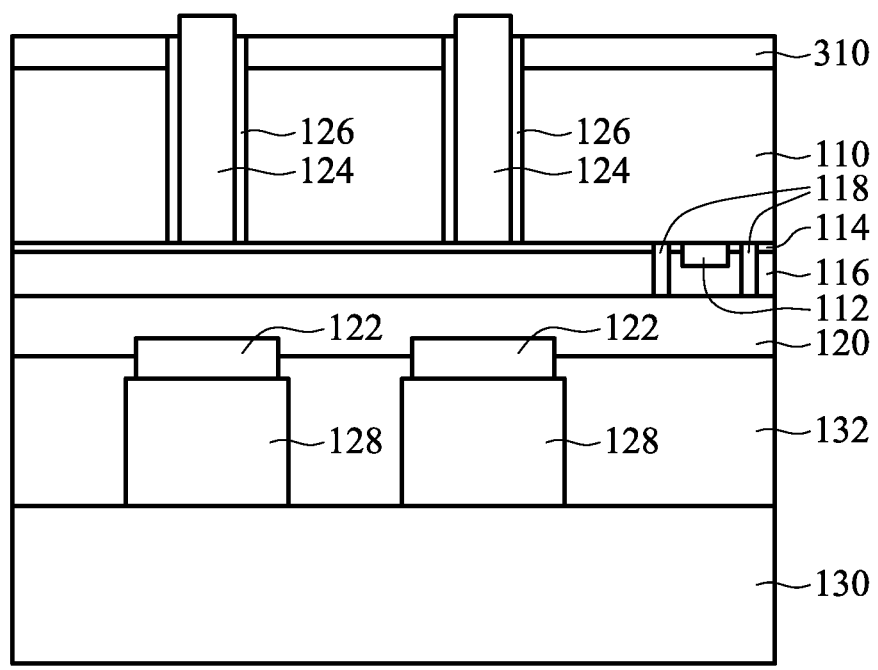

FIG. 4 illustrates a second exposure of the through-silicon vias 124 in accordance with an embodiment of the present invention. The thinning process may be performed using a mechanical grinding process, a CMP process, an etching process, and/or a combination thereof. For example, initially a planarizing process, such as grinding or a CMP, may be performed to initially expose the through-silicon vias 124. Thereafter, a wet or dry etching process having a high etch-rate selectivity between the material of the through-silicon vias 124 and the liners 126 and the material of the first isolation film 310 may be performed to recess the first isolation film 310, thereby leaving the through-silicon vias 124 protruding from the underside of the isolation film 310 as illustrated in FIG. 4. In an embodiment in which the through-silicon vias 124 are formed of copper and the first isolation film 310 is formed of silicon dioxide, the first isolation film 310 may be recessed by performing a wet etch using hydrofluoric acid or a dry etching process. Other processes and materials may be used. Preferably, the through-silicon vias 124 are exposed in the range of about sub-μm to about a few μms.

FIG. 4 also illustrates removing the liners 126 from the exposed portions of the through-silicon vias 124 along with the recess step of the first isolation film 310.

Figure 5:
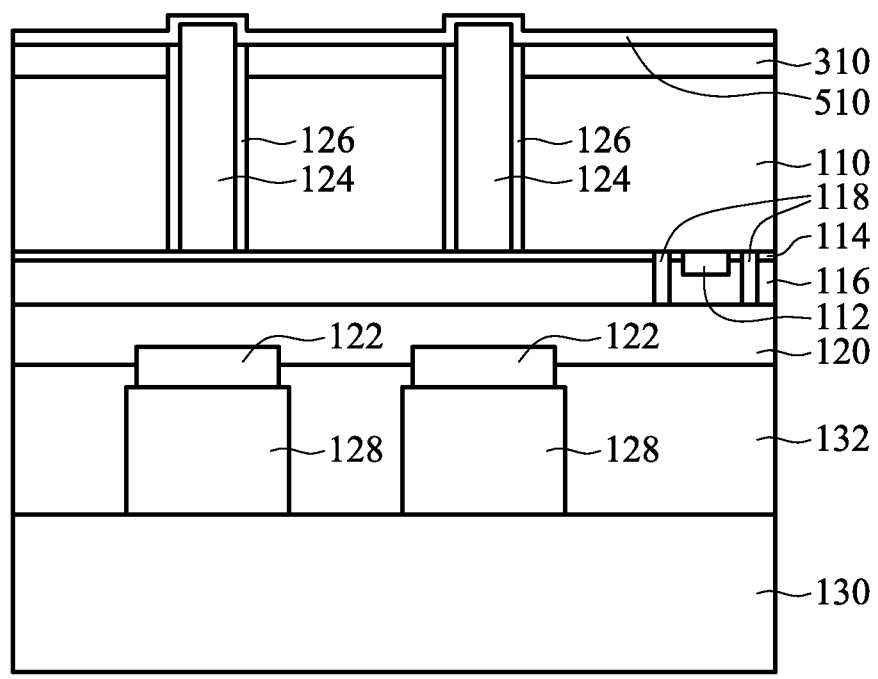

Referring now to FIG. 5, a conformal seed layer 510 is deposited over the surface of the isolation film 310 and the exposed portions of the through-silicon vias 124. The seed layer 510 is a thin layer of a conductive material that aids in the formation of a thicker layer during subsequent processing steps. In an embodiment, the seed layer 510 may be formed by depositing a thin conductive layer, such as a thin layer of Cu, Ti, Ta, TiN, TaN, or the like, using CVD or PVD techniques. For example, a layer of Ti is deposited by a PVD process to form a barrier film and a layer of Cu is deposited by a PVD process to form a seed layer.

Figure 6:
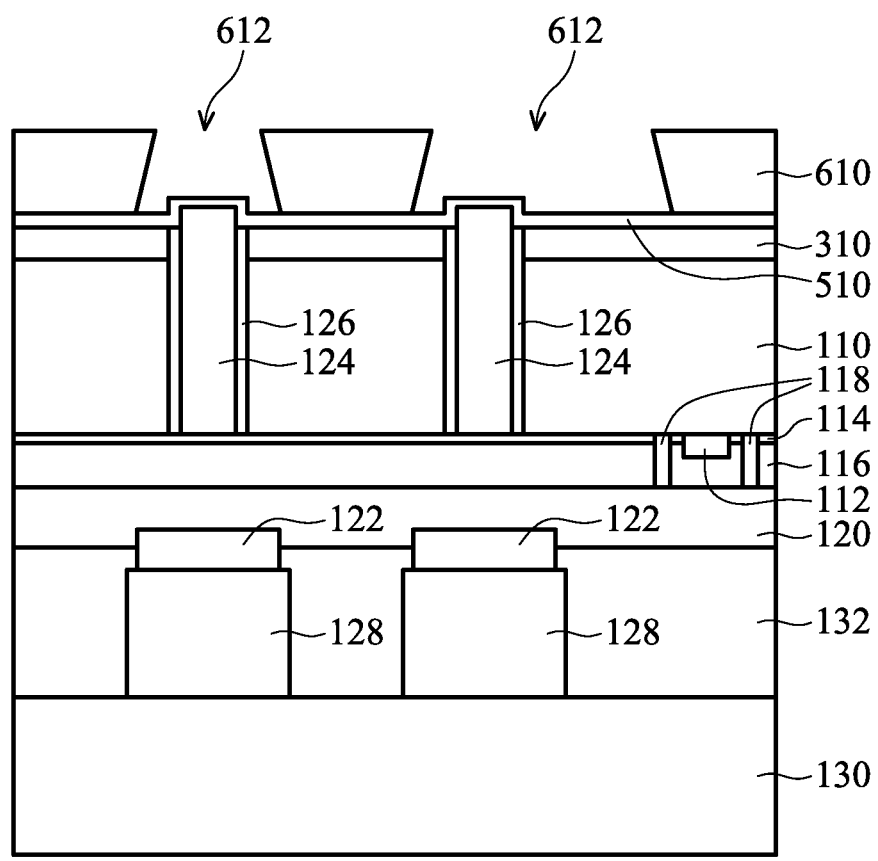

FIG. 6 illustrates a first patterned mask 610 formed over the seed layer 510 in accordance with an embodiment of the present invention. The first patterned mask 610 will act as a mold for forming conductive pads and redistribution lines in subsequent processing steps. The first patterned mask 610 may be a patterned photoresist mask, hard mask, or the like. In a preferred embodiment, a photoresist material is deposited to a thickness of about sub-μms to about several μms and patterned to form openings 612 over the through-silicon vias 124.

It should be noted that the embodiment illustrated in FIG. 6 preferably utilizes a re-entrant profile such that the openings 612 are wider along the bottom of the openings along the seed layer 510 than the top portion of the openings 612. The re-entrant profile may be created by any suitable technique, such as the use of multiple photoresist layers with different patterning properties and one or more exposures, diffusion techniques, an image reversal process, or the like. In other embodiments, however, the first patterned mask 610 may utilize a taper profile such that the openings 612 are narrower along a bottom of the opening along the seed layer 510 than the top portion of the openings 612.

Figure 7:
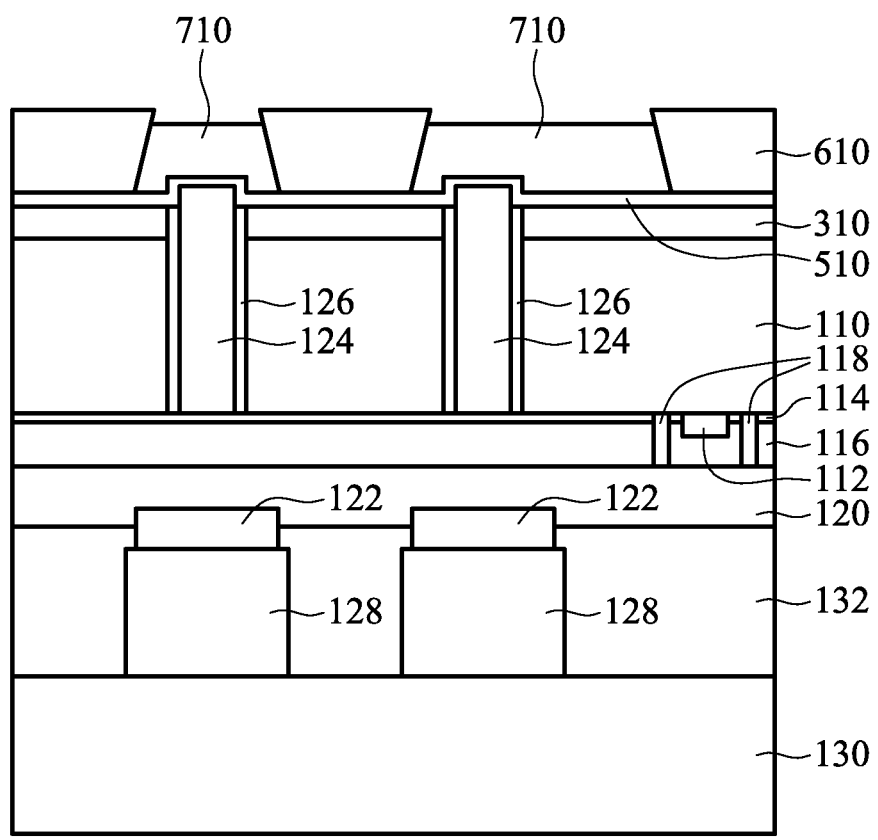

Thereafter, conductive elements 710 are formed in the openings 612 (see FIG. 6) as illustrated in FIG. 7. The conductive elements 710 are preferably metal, such as copper, tungsten, or other conductive metal, and may be formed, for example, by electroplating, electroless plating, or the like. In an embodiment, an electroplating process is used wherein the wafer is submerged or immersed in the electroplating solution. The wafer surface is electrically connected to the negative side of an external DC power supply such that the wafer functions as the cathode in the electroplating process. A solid conductive anode, such as a copper anode, is also immersed in the solution and is attached to the positive side of the power supply. The atoms from the anode are dissolved into the solution, from which the cathode, e.g., the wafer, acquires, thereby plating the exposed conductive areas of the wafer, e.g., exposed portions of the seed layer 510 within the openings 612.

It should be noted that the conductive elements 710 may be contact pads and/or redistribution lines. As illustrated in FIG. 14, which is a plan view of the embodiments illustrated in FIGS. 1-13, the conductive element 710 on the left side of FIG. 7 is a contact pad, whereas the conductive element 710 on the right side of FIG. 7 is a contact pad and a redistribution line. The redistribution line allows an electrical connection to another device, such as a die, wafer, packaging substrate, or the like, at a location other than the location of the TSV. This allows for greater flexibility and a higher degree of independence regarding the placement of the TSVs, the electrical circuitry on the substrate, and the pin-out locations.

Figure 8:
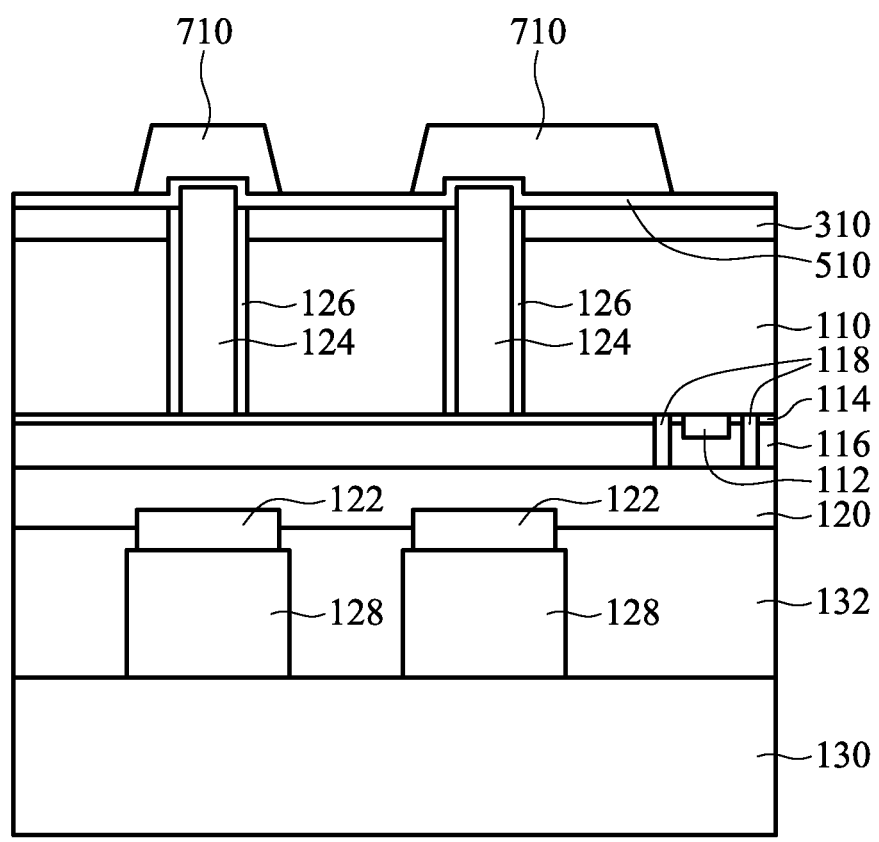

FIG. 8 illustrates the removal of the first patterned mask 610 (see FIGS. 6 and 7) in accordance with an embodiment of the present invention. In an embodiment in which the first patterned mask 610 is a photoresist mask, a plasma ashing or wet strip process may be used to remove the first patterned mask 610. One preferred plasma ashing process uses an $O_2$ flow rate of about 1000 sccm to about 2000 sccm at a pressure of about 300 mTorr to about 600 mTorr and at power of about 500 Watts to about 2000 Watts and at a temperature of about 80° C. to about 200° C., for example. Optionally, the plasma ashing process may be followed by a wet dip in a sulfuric acid ($H_2SO_4$) solution to clean the wafer and remove remaining photoresist material.

Figure 9:
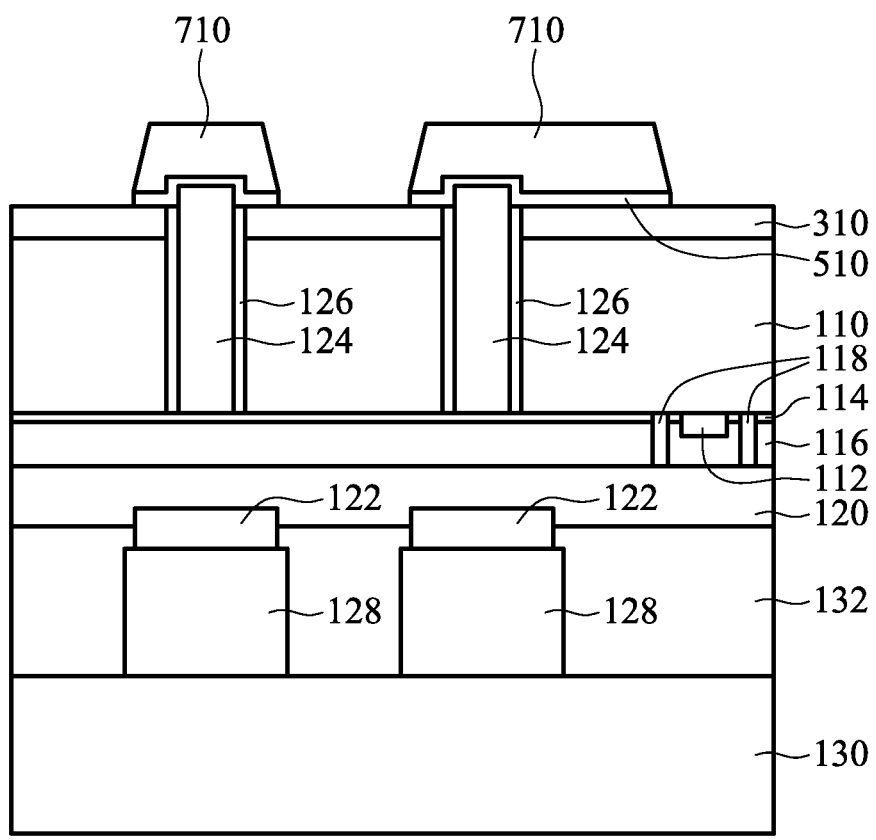

FIG. 9 illustrates removal of the exposed portions of the seed layer 510. Exposed portions of the seed layer 510 may be removed by, for example, a wet etching process.

Figure 10:
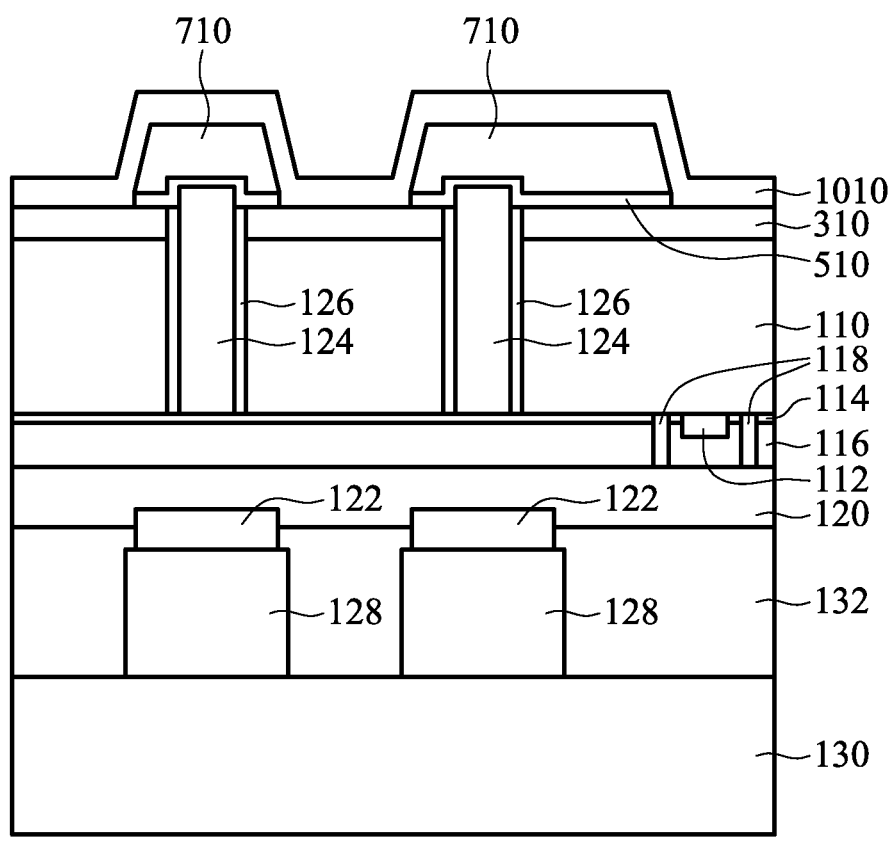

FIG. 10 illustrates formation of a second isolation film 1010 in accordance with an embodiment of the present invention. The second isolation film 1010 may be formed using similar processes and materials as those used to form the first isolation film 310. It is preferable, however, that the material used to form the second isolation film 1010 have a high etch rate selectivity with the material used to form the first isolation film 310. In this manner, the first isolation film 310 (and the conductive elements 710) may be used as an etch stop when patterning the second isolation film 1010 in a subsequent processing step. The second isolation film 1010 preferably has a thickness of about 2000 Å to about 8000 Å. As will be discussed below, the second isolation film 1010 will be patterned to isolate portions of the redistribution line while leaving contact pad locations exposed.

Figure 11:
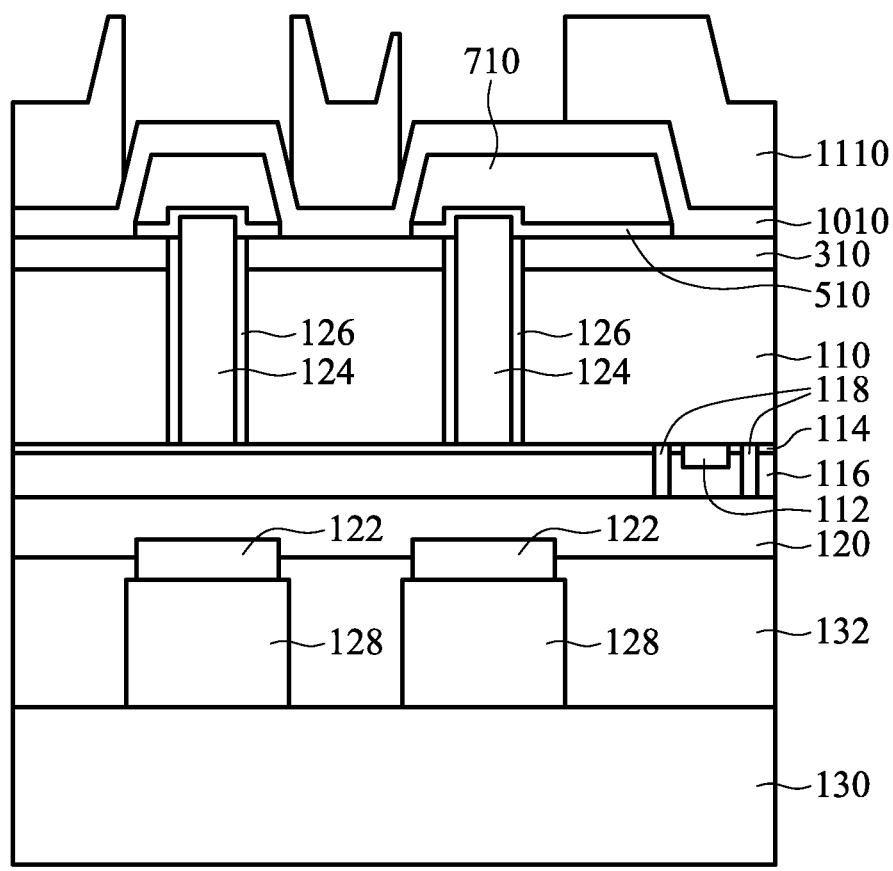

FIG. 11 illustrates forming a second patterned mask 1110 in accordance with an embodiment of the present invention. The second patterned mask 1110 may be formed using similar materials, e.g., photoresist or hard mask materials, and similar processes as the first patterned mask 610. It should be noted, however, that the first patterned mask 610 preferably utilized techniques that created a re-entrant pattern, but the second patterned mask 1110 has a vertical pattern. As such, for example, any suitable photolithography technique may be used to create the second patterned mask 1110.

Figure 12:
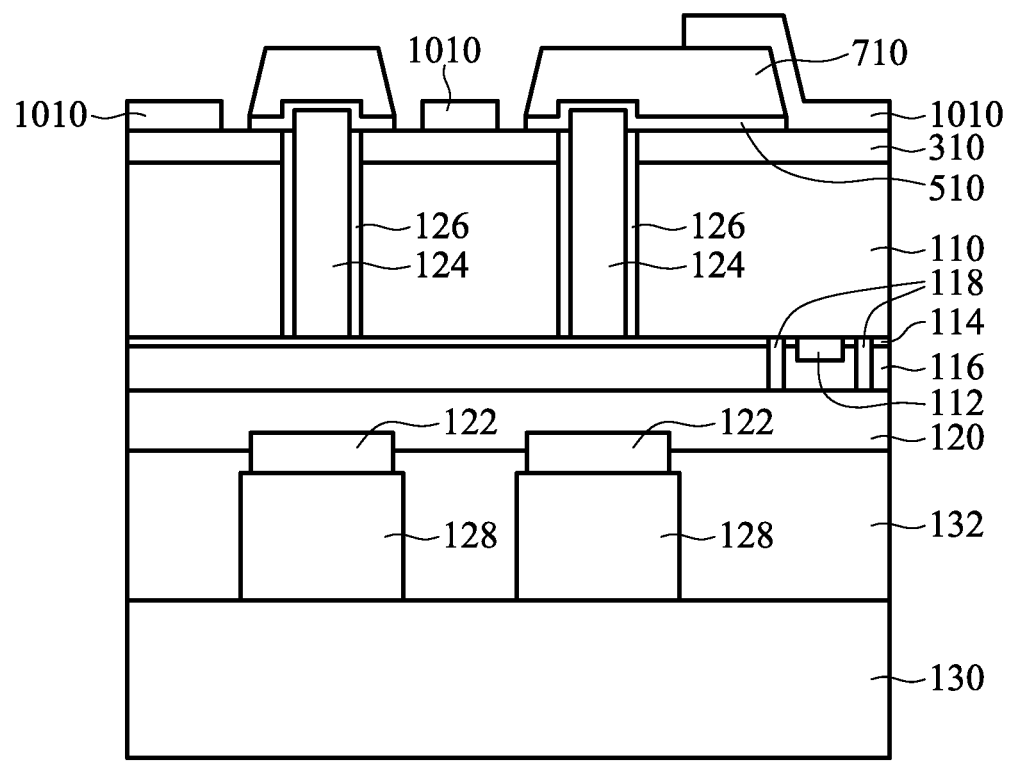

FIG. 12 illustrates patterning the second isolation film 1010 and removing the second patterned mask 1110 in accordance with an embodiment of the present invention. For example, in an embodiment in which the second isolation film 1010 is formed of silicon nitride and the first isolation film 310 is formed of silicon dioxide, the second isolation film 1010 may be patterned using a dry etching process, wherein the process has a high etch rate selectivity between the silicon nitride of the second isolation film 1010 and the silicon dioxide of the first isolation film 310.

After patterning the second isolation film 1010, the second patterned mask 1110 may be removed as illustrated in FIG. 12. The second patterned mask 1110 may be removed by, for example, a plasma ashing process or a wet strip process as discussed above with reference to FIG. 7. Optionally, a cleaning step, such as a wet dip in sulfuric acid, may be performed after removing the second patterned mask 1110 to remove any contaminants from the surface.

Figure 13:
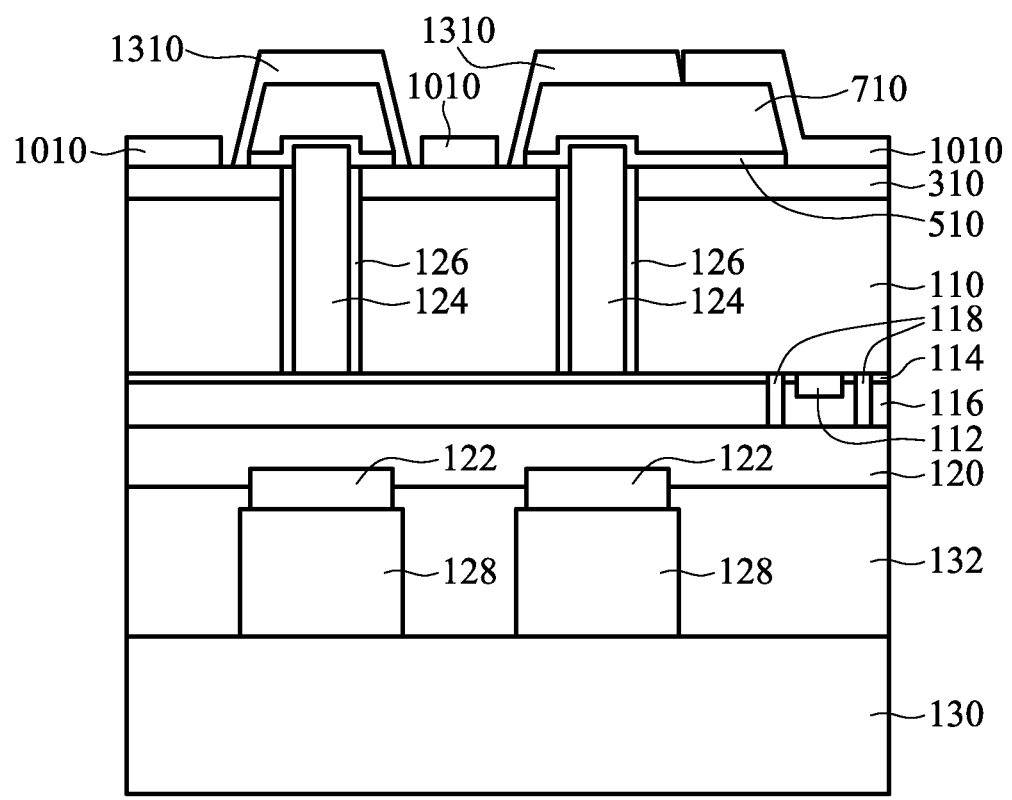
Figure 14:
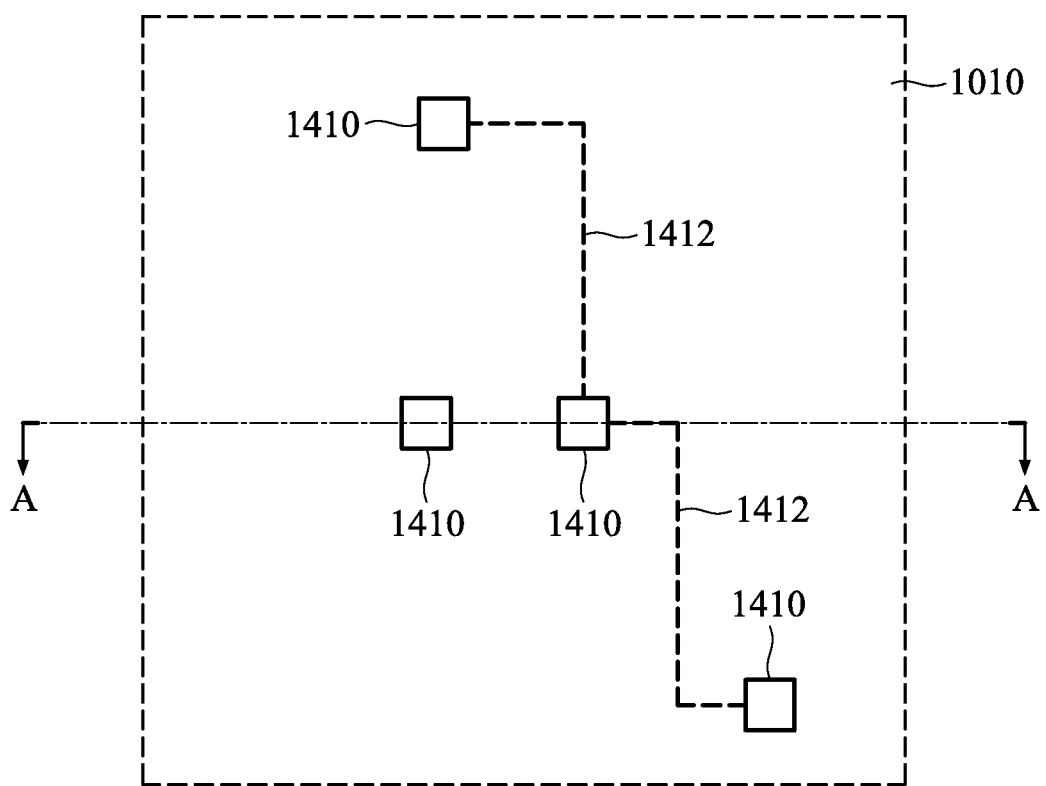
FIG. 14 is a plan view of a pin-out configuration in accordance with an embodiment of the present invention.

FIG. 13 illustrates forming a contact barrier layer 1310 in accordance with an embodiment of the present invention. The contact barrier layer 1310 represents the conductive contact points where external devices, e.g., another die, wafer, circuit board, package board, or the like, make an electrical connection. The contact barrier layer 1310 is in electrical contact with the TSVs 124, which in turn are in electrical contact with electrical circuitry formed on the substrate, such as electrical circuitry 112, or to another external device, such as another die, wafer, circuit board, package board, or the like.

In an embodiment, the contact barrier layer 1310 is formed of a metal or metal alloy, such as Ni, AuSu, Au, or the like, using electroless plating techniques. Other methods and techniques, however, may be used. The material for the contact barrier layer 1310 should be selected to enhance the adhesion properties between the conductive elements 710 and the contact element on the external device. It should be noted that the conductive elements 710 and the contact barrier layer 1310 together form contact pads on which other devices, such as dies, wafers, substrates, or the like, may be connected.

FIG. 14 is a plan view of an arrangement of the contact pads 1410 and the redistribution lines 1412 in accordance with an embodiment of the present invention. FIGS. 1-13 are cross section views taken along the A-A line. The second isolation film 1010 acts as a passivation layer and covers the backside of the substrate, except for the exposed contact pads 1410 (e.g., the contact barrier layer 1310 and the underlying conductive elements 710). The second isolation film 1010 is formed over the redistribution lines, which are shown by the dotted lines.

It should be appreciated that the embodiments discussed above allow the simultaneous formation of the contact pads and the redistribution line. The use of a redistribution layer allows the same design to be utilized with different pin-outs and technologies. The conductive bumps with tapered sidewalls also provide a larger bonding interface for wafer and/or die stacking processes.

Figure 15:
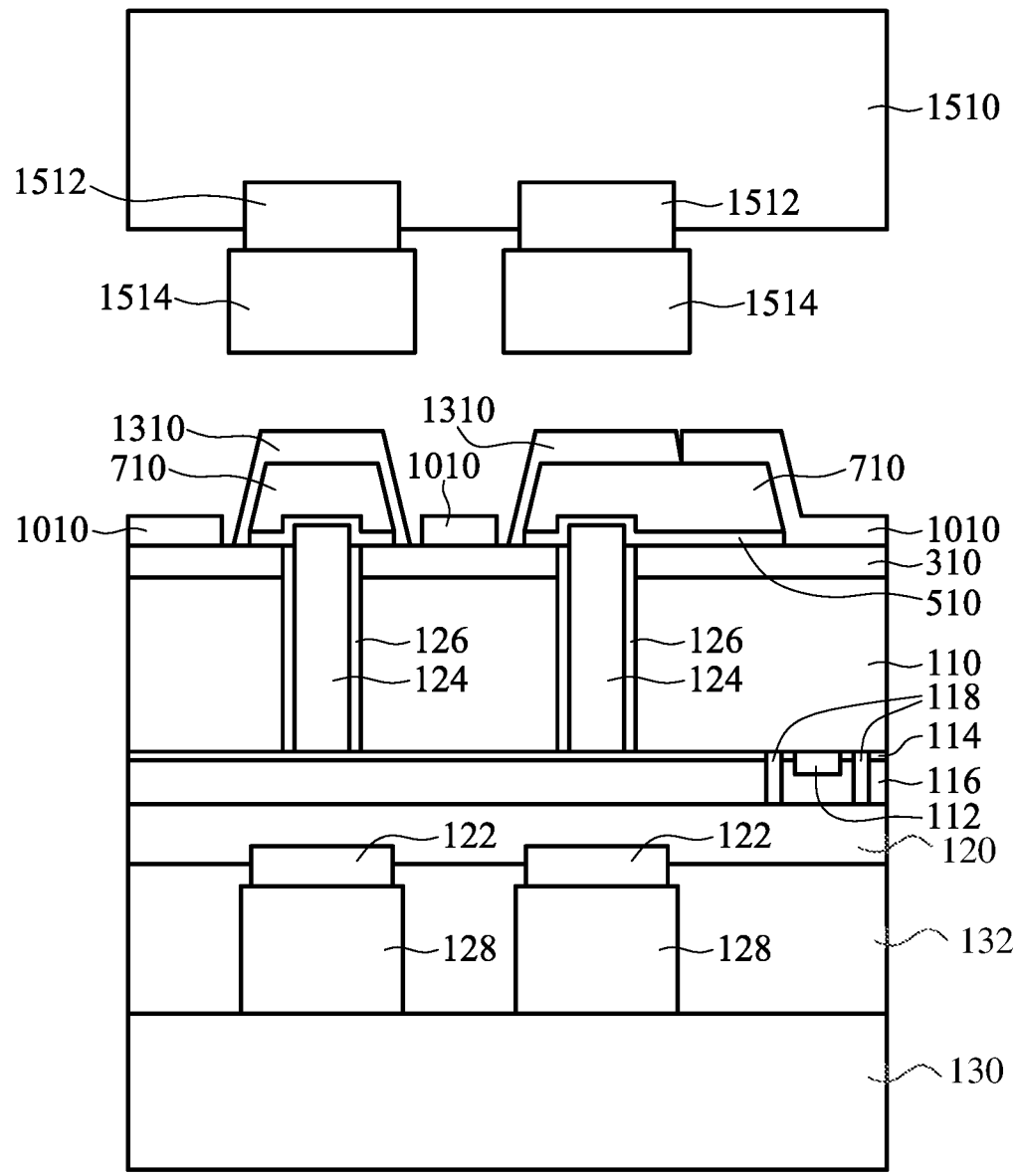
FIGS. 15-17 illustrate intermediate stages in forming a stacked die configuration in accordance with another embodiment of the present invention.
Figure 16:
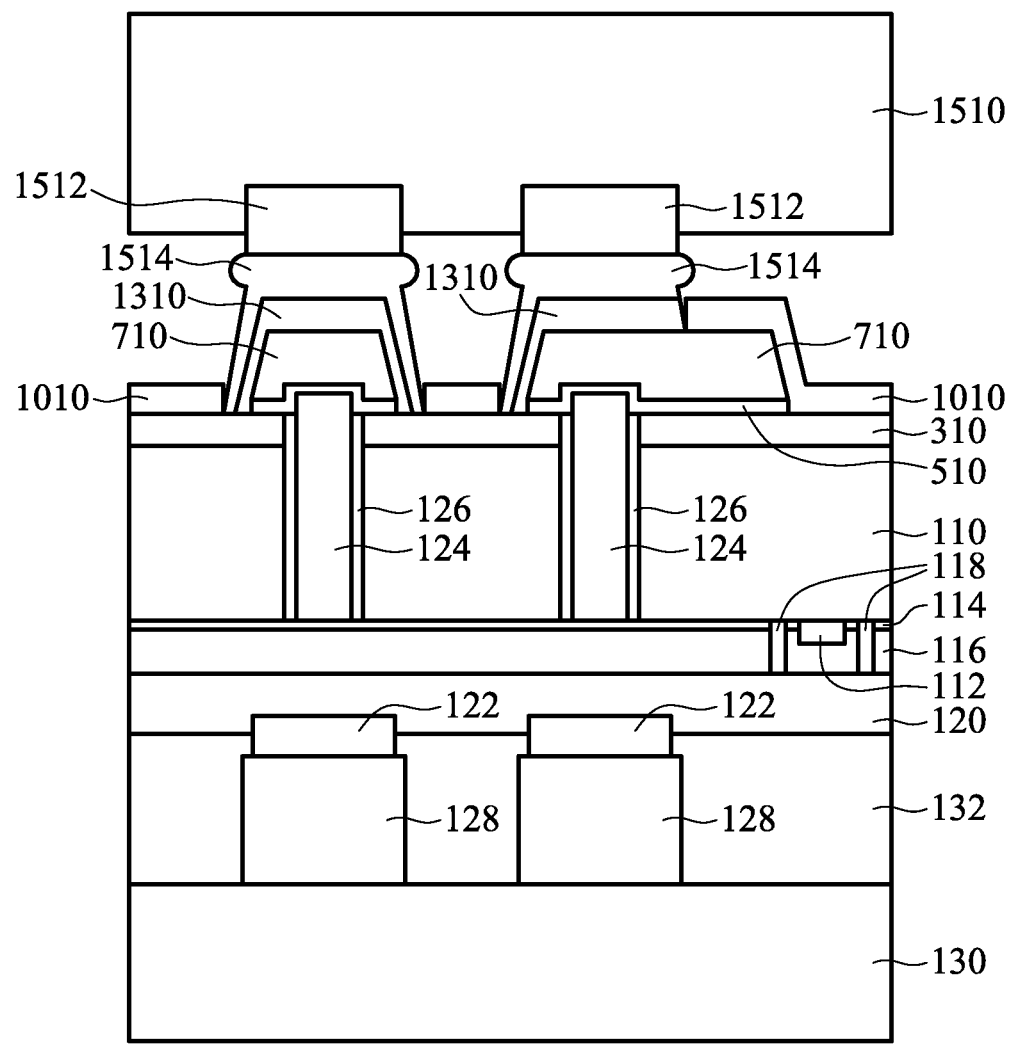
Figure 17:
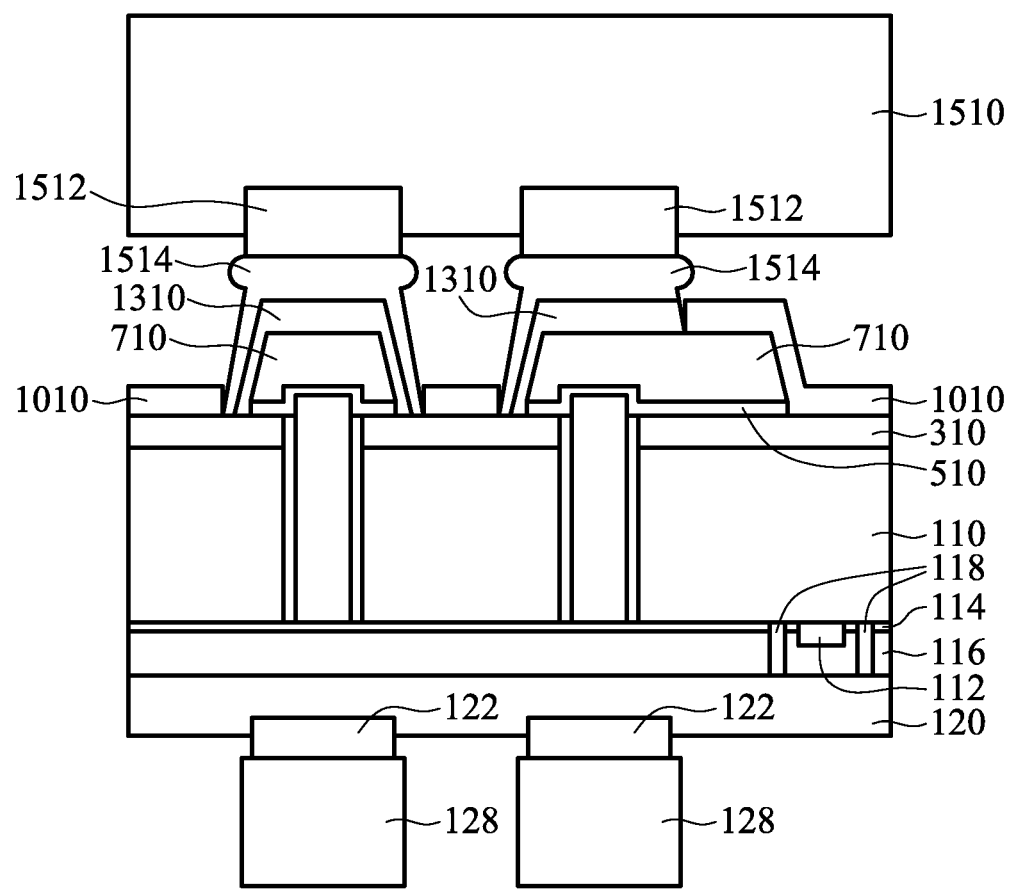

FIGS. 15-17 illustrate bonding the structure discussed above with reference to FIGS. 1-14 to another structure in accordance with an embodiment of the present invention. In particular, a substrate 1510 is shown having top metal contacts 1512 and connection elements 1514. The connection elements 1514 may be, for example, solder balls. The substrate 1510 may be attached to the semiconductor substrate 110 by aligning the connection elements 1514 with the contact pads 1410 and applying pressure and/or heat to cause the connection elements 1514 to adhere and form an electrical connection to the contact barrier layer 1310 as illustrated in FIG. 16. Due to the taper-like shape of the contact barrier layer 1310 and the conductive elements 710, a larger wetting surface for the bonding interface is provided, thereby creating a better electrical connection as well as providing additional structural support.

As illustrated in FIG. 17, the temporary carrier substrate 130 may be removed, allowing the conductive bumps 128 on the circuit-side of the semiconductor substrate 110 to be bonded to another die, wafer, substrate, or board. Thereafter, other back-end-of-line processing techniques suitable for the particular application may be performed. For example, a filler material may be injected between stacked dies, an encapsulant may be formed, a singulation process may be performed to singulate individual stacked-die packages, and the like, may be performed. It should be noted, however, that embodiments of the present invention may be used in many different situations. For example, embodiments of the present invention may be used in a die-to-die bonding configuration, a die-to-wafer bonding configuration, or a wafer-to-wafer bonding configuration.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a semiconductor device, the method comprising:
   providing a first semiconductor substrate, the first semiconductor substrate having a through via extending from a first side into the first semiconductor substrate, the through via being conductive;
   exposing, after the providing, the through via on a second side of the first semiconductor substrate;
   forming, after the exposing, a first isolation film along a top surface of the second side of the first semiconductor substrate such that the through via is exposed;
   forming, after the forming the first isolation film, a conductive element with tapered sidewalls on the through via, the conductive element being positioned on the top surface of the second side;
   forming a second isolation film on the first isolation film, the first isolation film and the second isolation film being formed of different materials, and wherein the second isolation film is formed on, and covers, at least a portion of a first side of the conductive element; and
   forming a contact barrier layer after forming the second isolation film, the contact barrier layer formed over at least a portion of a second side of the conductive element and a portion of the top surface of the conductive element.

2. The method of claim 1, wherein the forming the conductive element comprises using a patterned mask with re-entrant openings as a mold for the conductive element.

3. The method of claim 2, wherein the forming the conductive element further comprises forming the patterned mask with re-entrant openings by applying a mask layer and removing portions of the mask layer to form the re-entrant openings.

4. The method of claim 1, wherein the exposing the through via comprises etching the first semiconductor substrate below a surface of the through via such that the through via protrudes from the first semiconductor substrate.

5. The method of claim 1, wherein the forming the first isolation film comprises forming a layer of insulating material, planarizing the layer of insulating material, and etching the layer of insulating material to expose the through via.

6. The method of claim 1, wherein the through via protrudes from the first isolation film.

7. The method of claim 1, wherein the forming the conductive element comprises:
   forming a seed layer over the first isolation film and the through via;
   forming a patterned mask over the seed layer, the patterned mask having re-entrant openings exposing the seed layer over the through via;
   forming a metal pad over exposed portions of the seed layer;
   removing the patterned mask; and
   removing exposed portions of the seed layer.

8. The method of claim 1, further comprising removing a liner from exposed portions of the through via.

9. A method of forming a semiconductor device, the method comprising:
   providing a first semiconductor substrate having a plurality of through vias extending from a circuit-side to a backside of the first semiconductor substrate, a conductive pad having tapered sidewalls being located over each of the plurality of through vias on a top surface of the backside such that the conductive pad has a larger width closest to the through vias than a region farther from the through vias, the backside of the first semiconductor substrate having a first isolation film on the top surface of the backside and a second isolation film on the first isolation film and covering a first sidewall of the conductive pad, the conductive pad having a contact barrier layer covering a second sidewall and a portion of the top surface of the conductive pad;
   providing a second semiconductor substrate having a plurality of top contacts; and
   bonding the first semiconductor substrate to the second semiconductor substrate such that each of the plurality of top contacts of the second semiconductor substrate are electrically coupled with respective ones of the conductive pads on the first semiconductor substrate.

10. The method of claim 9, wherein at least some of the conductive pads comprise a redistribution line, and wherein the second isolation film covers at least a portion of the conductive pads.

11. The method of claim 10, wherein the redistribution line is between the first isolation film and the second isolation film.

12. The method of claim 9, wherein the bonding is performed at least in part by a metal bump.

* * * * *